(12) United States Patent
Lin

(10) Patent No.: US 6,359,785 B1
(45) Date of Patent: Mar. 19, 2002

(54) POWER DIODE AND HEAT SINK ARRANGEMENT

(76) Inventor: Chin-Feng Lin, 3F., No. 2, Lane 8, Fu Yuan Street, Hsintien, Taipei Hsien (TW)

( * ) Notice: Subject to any disclaimer, the term of this patent is extended or adjusted under 35 U.S.C. 154(b) by 0 days.

(21) Appl. No.: 09/753,577

(22) Filed: Jan. 4, 2001

(51) Int. Cl.$^7$ ................................................ H05K 7/20
(52) U.S. Cl. ...................... 361/711; 165/80.3; 257/713; 257/724; 439/487
(58) Field of Search ................................ 165/80.3, 185; 174/16.3, 52.2; 257/706, 707, 712, 715, 723, 724; 361/702–705, 707–711, 713, 722, 717–719; 439/485, 487

(56) References Cited

U.S. PATENT DOCUMENTS

| | | | | |
|---|---|---|---|---|
| 5,373,105 A | * | 12/1994 | Nagaune et al. | 174/52.2 |
| 5,912,804 A | * | 6/1999 | Lawson et al. | 361/704 |
| 6,254,423 B1 | * | 7/2001 | Lin | 439/487 |

* cited by examiner

*Primary Examiner*—Gerald Tolin
(74) *Attorney, Agent, or Firm*—Troxell Law Office PLLC

(57) ABSTRACT

A power diode and heat sink arrangement includes two power diodes fastened to a heat sink, a copper plate soldered to the power diodes at the top to hold a terminal holder, and a ceramic pad connected between the heat sink and the copper plate and spaced between the chips and adapted to support the copper plate against deformation and to transmit heat from the copper plate to the heat sink for quick dissipation.

1 Claim, 4 Drawing Sheets

POWER DIODE AND HEAT SINK ARRANGEMENT

BACKGROUND OF THE INVENTION

The present invention relates to power diodes and, more specifically, to a power diode and heat sink arrangement, which improves the performance of heat dissipation and, protects the chips against deformation and displacement during its installation.

FIG. 1 shows the arrangement of a power diode and heat sink for use in an electronic apparatus of high power output. This structure of power diode and heat sink arrangement comprises a heat sink 1', and two power diodes 2' installed in the heat sink 1'. The power diodes 2' each comprises two chips 21' respectively soldered to the heat sink 1' each chip 21' having two molybdenum pads 23' respectively soldered to top and bottom sides thereof, a copper plate 22' connected between the chips 21' at the top side and soldered to the top-sided molybdenum pads 23' of the chips 21', a terminal holder 24' fastened to the copper plate 22' at the top side, and a copper screw 25' fastened to the terminal holder 24' to secure an electric wire. Because the copper plate 22' is suspended above the heat sink 1', the forward stress and side torsional force are directly transmitted to the copper plate 24' and the chips 21' when fastening up the copper screw 25', thereby causing the copper plate 22' to deform and the chips 21' to displace easily.

SUMMARY OF THE INVENTION

The present invention has been accomplished to provide a power diode and heat sink arrangement, which eliminates the aforesaid problems. It is one object of the present invention to provide a power diode and heat sink arrangement, which achieves a high performance in heat dissipation. It is another object of the present invention to provide a power diode and heat sink arrangement, which protects the copper plate and the chips against deformation and displacement. According to the present invention, a ceramic pad is connected between the heat sink and the copper plate of each power diode and spaced between the chips of the respective power diode and adapted to support the copper plate against deformation and to transmit heat from the copper plate to the heat sink for quick dissipation.

BRIEF DESCRIPTIONN OF THE DRAWINGS

DETAILED DESCRIPTION OF THE PREFERRED EMBODIMENT

Figure 1:
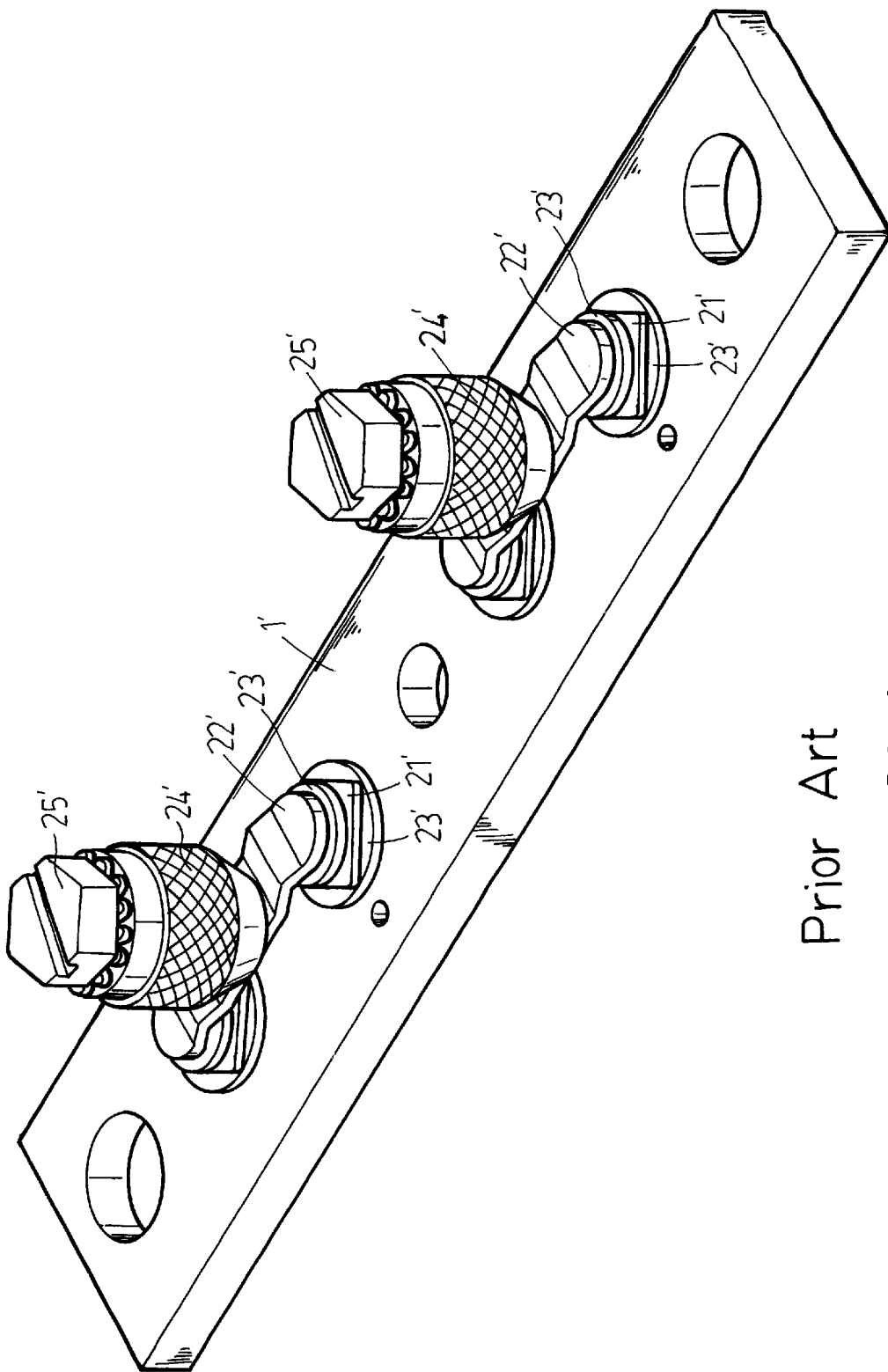
FIG. 1 illustrates a power diode and heat sink arrangement according to the prior art (the electrically insulative shell of each power diode excluded).
Figure 2:
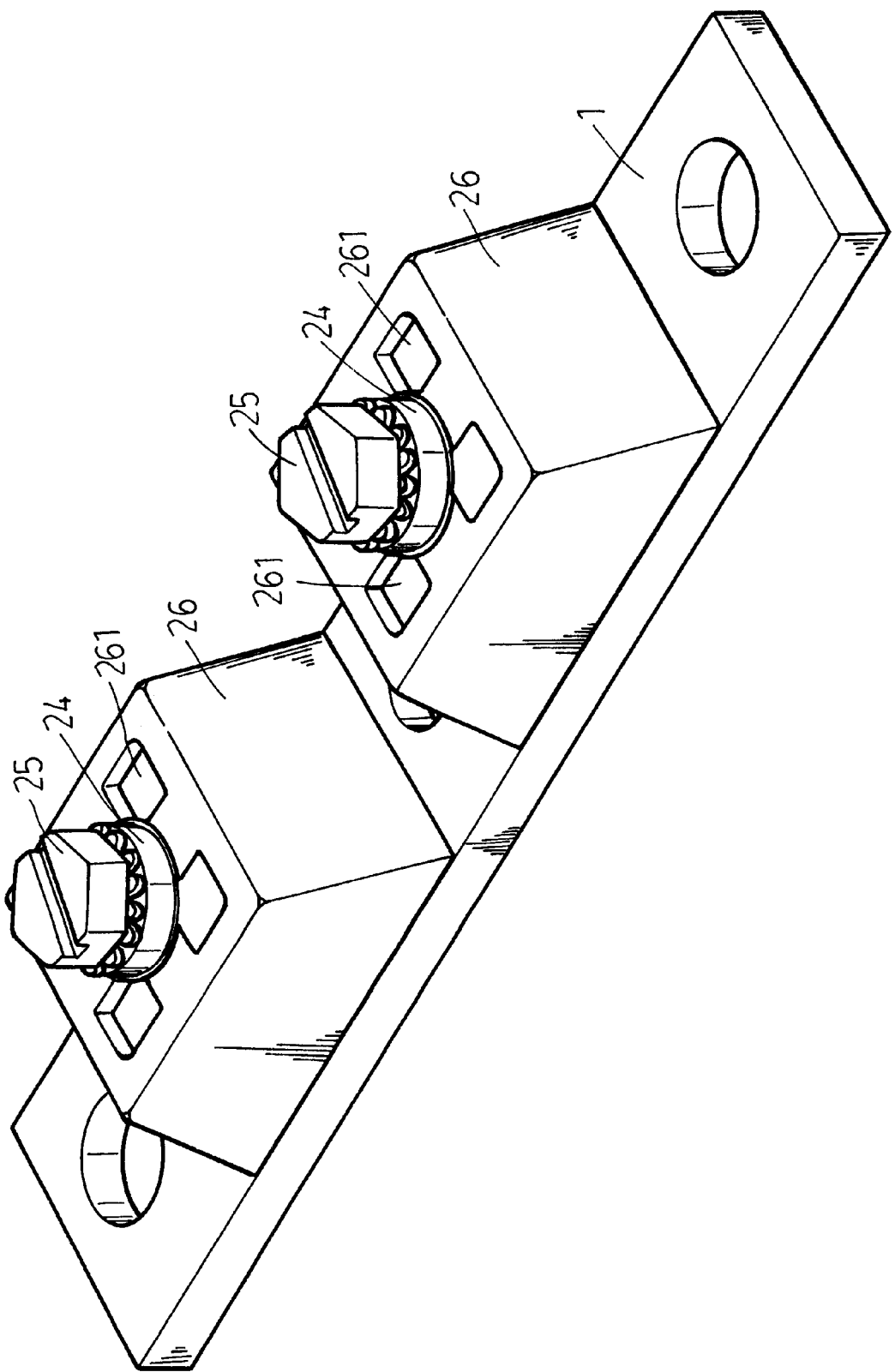
FIG. 2 shows the outer appearance of a power diode and heat sink arrangement according to the present invention.
Figure 3:
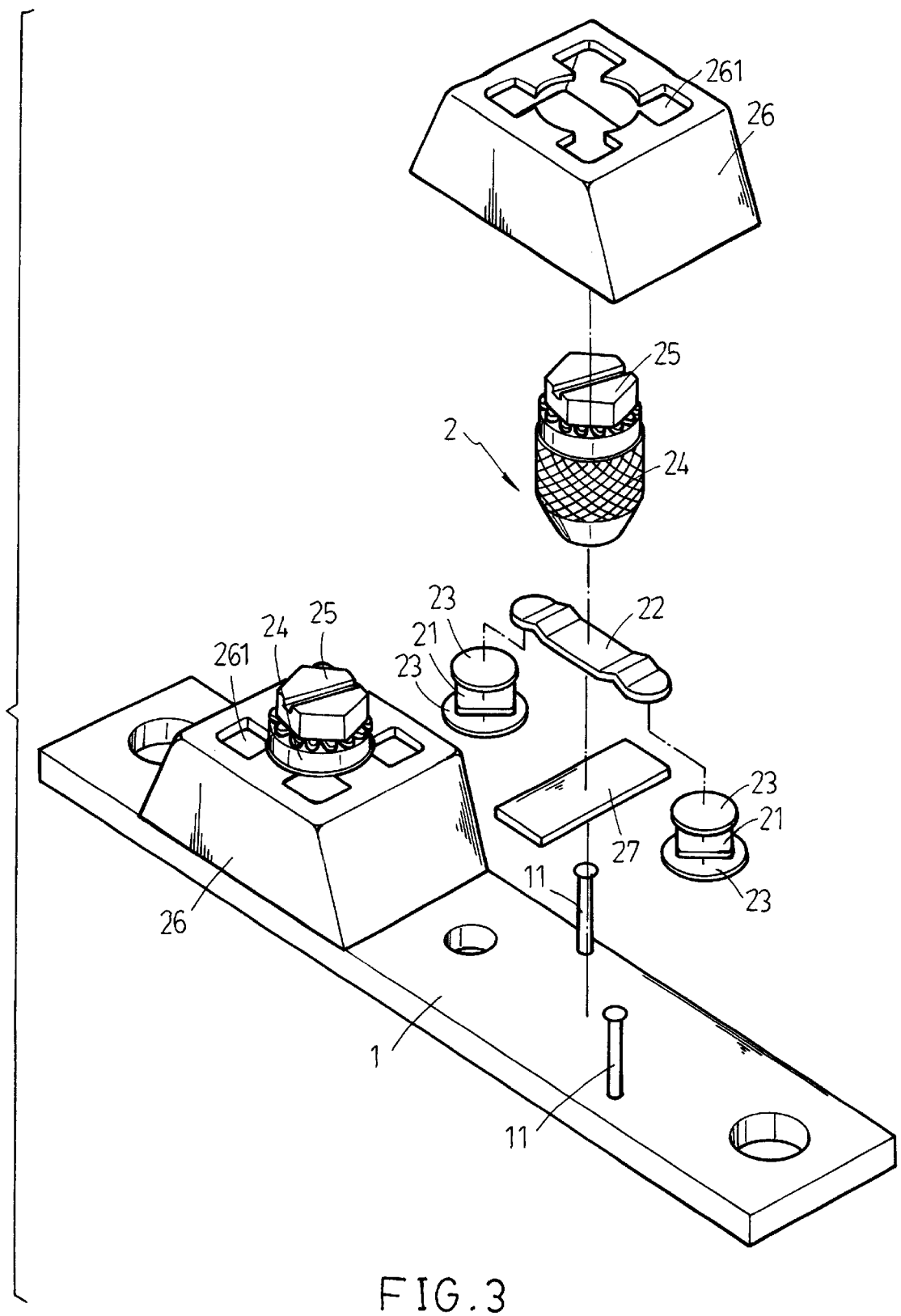
FIG. 3 is an exploded view of the power diode and heat sink arrangement according to the present invention.
Figure 4:
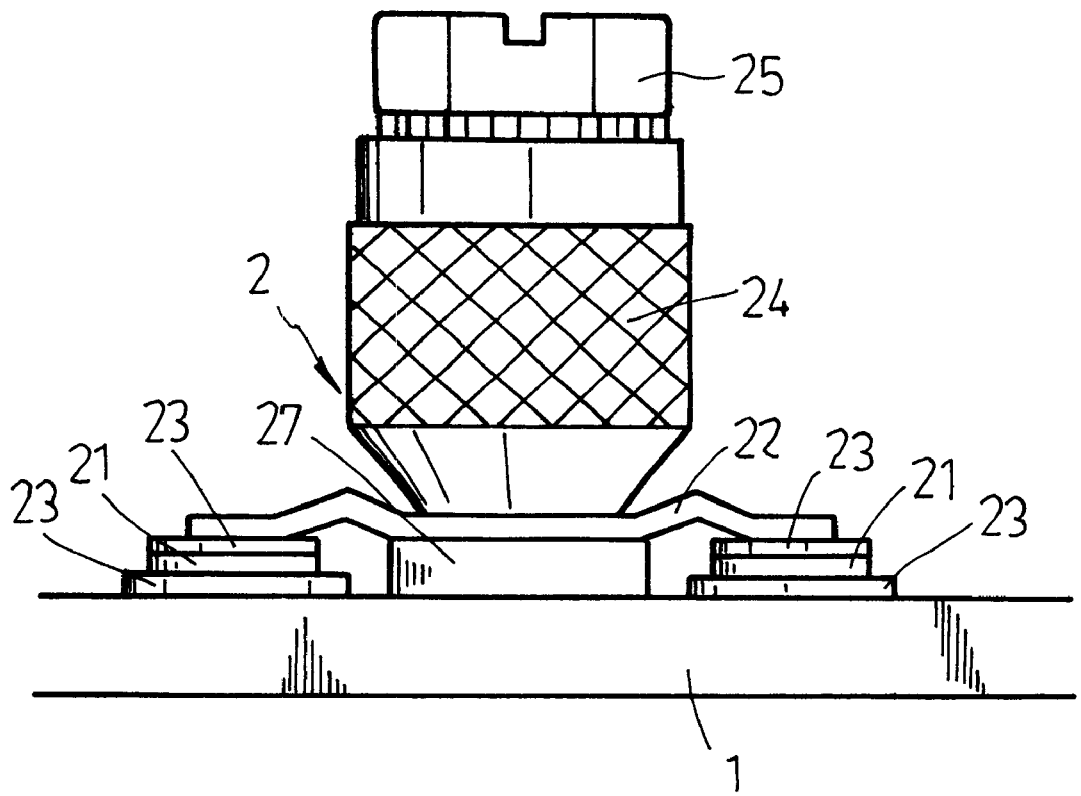
FIG. 4 is a side plain view of a part of the present invention, showing the arrangement of one power diode on the heat sink.

Referring to FIGS. from 2 through 4, a power diode and heat sink arrangement in accordance with the present invention is generally comprised of a heat sink 1, and two power diodes 2. The power diodes 2 each comprises two chips 21 soldered to the heat sink 1, each chip 21 having two molybdenum pads 23 respectively soldered to top and bottom sides thereof, a copper plate 22 connected between the chips 21 at the top side and soldered to the top-sided molybdenum pads 23 of the chips 21, a terminal holder 24 fastened to the copper plate 22 at the top side, a copper screw 25 fastened to the terminal holder 24 to secure an electric wire, a ceramic pad 27 supported between the heat sink 1 and the copper plate 22 and spaced between the chips 21, and an electrically insulative shell 26 covered on a part of the heat sink 1 over the chips 21 and the copper plate 22 around the periphery of the terminal holder 24. The electrically insulative shell 26 has coupling holes 261 coupled to respective upright pins 11 at the heat sink 1. When installed, a resin is melted and filled in the electrically insulative shell 26 to fixedly secure all parts of the power diode 2 to the heat sink 1.

Because the copper plate 22 is supported on the ceramic pad 27, it does not deform during the encapsulation procedure. Because the ceramic pad 27 is disposed between the chips 21, the forward stress and side torsional force are concentrated at the ceramic pad 27 and the soldering area of the chips 21 receive no pressure during the installation of the copper screw 25.

When the power diodes 2 produce a high power output, heat is directly transmitted from the terminal holder 24 to the heat sink 1 through the ceramic pad 27 for quick dissipation, preventing the chips 21 from overheat.

It is to be understood that the drawings are designed for purposes of illustration only, and are not intended for use as a definition of the limits and scope of the invention disclosed.

What the invention claimed is:

1. A power diode and heat sink arrangement of the type comprising a heat sink, and two power diodes installed in said heat sink, said power diodes each comprising two chips respectively soldered to said heat sink, a copper plate soldered to said chips and connected between said chips at a top side, a terminal holder fastened to said copper plate at a top side, a copper screw fastened to said terminal holder to secure an electric wire, and an electrically insulative shell covered on a part of said heat sink over said chips and said copper plate around the periphery of said terminal holder, wherein a ceramic pad is connected between said heat sink and said copper plate and spaced between said chips for transmitting heat from said copper plate to said heat sink.

* * * * *